United States Patent
Chang et al.

(10) Patent No.: US 12,094,691 B2
(45) Date of Patent: Sep. 17, 2024

(54) ETCH APPARATUS FOR COMPENSATING SHIFTED OVERLAYERS

(71) Applicant: Taiwan Semiconductor Manufacturing Co., Ltd., Hsinchu (TW)

(72) Inventors: Chun-Yen Chang, Hsinchu (TW); Yu-Tien Shen, Hsinchu (TW); Chih-Kai Yang, Hsinchu (TW); Ya-Hui Chang, Hsinchu (TW); Shih-Ming Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 531 days.

(21) Appl. No.: 17/369,838

(22) Filed: Jul. 7, 2021

(65) Prior Publication Data
US 2022/0102118 A1    Mar. 31, 2022

Related U.S. Application Data

(60) Provisional application No. 63/085,718, filed on Sep. 30, 2020.

(51) Int. Cl.
*H01J 37/32* (2006.01)
*H01L 21/68* (2006.01)
*H01L 21/683* (2006.01)

(52) U.S. Cl.
CPC .. *H01J 37/32623* (2013.01); *H01J 37/32715* (2013.01); *H01J 37/32935* (2013.01); *H01L 21/68* (2013.01); *H01L 21/6833* (2013.01); *H01J 2237/334* (2013.01)

(58) Field of Classification Search
CPC ........... H01J 2237/334; H01J 37/32623; H01J 37/32715; H01J 37/32935; H01L 21/68; H01L 21/6833; H01L 21/68764
See application file for complete search history.

(56) References Cited

U.S. PATENT DOCUMENTS

| | | | | |
|---|---|---|---|---|
| 2019/0148180 A1* | 5/2019 | Bello | ............... | G01J 5/0007 |
| | | | | 250/338.3 |
| 2019/0250516 A1* | 8/2019 | Buhl | ............... | H01L 21/0274 |
| 2019/0259708 A1* | 8/2019 | Tang | ............... | G03F 9/7076 |
| 2022/0139717 A1* | 5/2022 | Sreenivasan | ........ | H01L 29/0676 |
| | | | | 438/745 |
| 2022/0342316 A1* | 10/2022 | Kooiman | ............ | G03F 7/70625 |
| 2023/0100123 A1* | 3/2023 | Van Weperen | ....... | G03F 7/7085 |
| | | | | 250/372 |

FOREIGN PATENT DOCUMENTS

JP          7329386 B2 *   8/2023

* cited by examiner

*Primary Examiner* — Edward Chin
(74) *Attorney, Agent, or Firm* — Seed IP Law Group LLP (57) ABSTRACT

The current disclosure includes a plasma etching system that includes a movable plasma source and a moveable wafer stage. A relative position between the movable plasma source and the movable wafer stage can be varied to set up an angle along which plasma particles of the plasma hits a wafer positioned on the wafer stage.

20 Claims, 8 Drawing Sheets

ETCH APPARATUS FOR COMPENSATING SHIFTED OVERLAYERS

BACKGROUND

Plasma etching is a form of plasma processing used to fabricate integrated circuits. It involves a high-speed stream of glow discharge (plasma) of an appropriate gas mixture being shot (in pulses) at a sample. The plasma source, known as etch species, can be either charged (ions) or neutral (atoms and radicals). During the process, the plasma generates volatile etch products at room temperature from the chemical reactions between the elements of the material etched and the reactive species generated by the plasma. Eventually the atoms of the shot element embed themselves at or just below the surface of the target, thus modifying the physical properties of the target. Using plasma etching, small features can be etched into the surface of the semiconducting material. For example, plasma etching can be used to create deep trenches on the surface of silicon for uses in microelectromechanical systems.

As devices become smaller and integration density increases, reactive ion etching (ME), as a type of plasma etching, has become a key process in anisotropic etching of semiconductor features. RIE or ion-enhanced etching works by a combination of physical and chemical mechanisms for achieving selectivity and anisotropicity during the etching process. Generally, RIE operates in the milliTorr range and above. Generally, three processes compete with each other during plasma etching, physical bombardment by ions, chemical etching by radicals and ions, and surface passivation by the deposition of passivating films. In some applications, for example, etching high aspect ratio features, high density plasma (HDP) etching having a higher density of ions and operating at lower pressures has been increasingly used in etching high aspect ratio features, for example, having aspect ratios greater than about 3:1.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
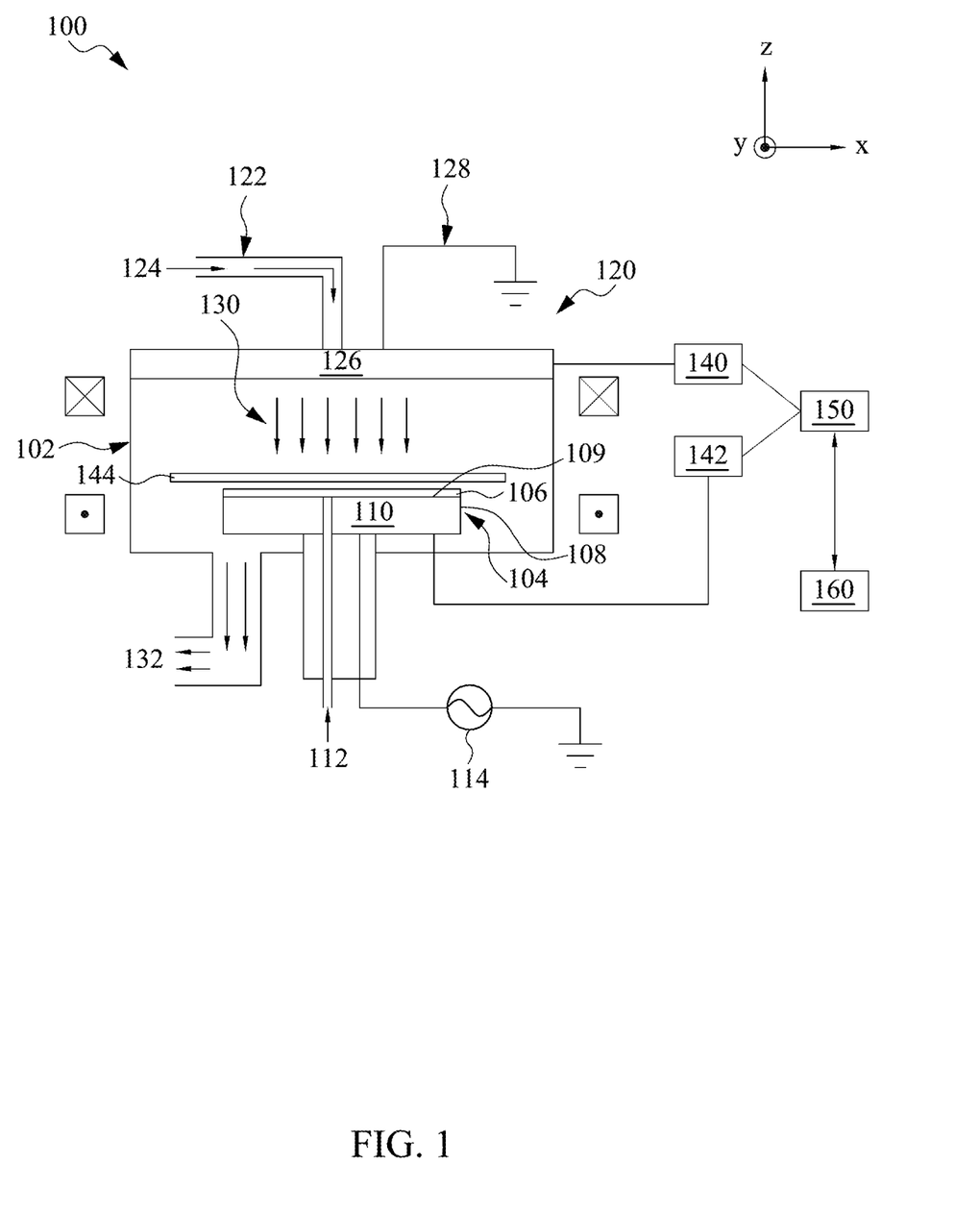
FIG. 1 is an example plasma etching system.

FIG. 1 shows a block diagram of one embodiment of a plasma etching system (or plasma system) 100. As shown in FIG. 1, plasma system 100 has a processing chamber 102. In an embodiment, processing chamber 102 is a symmetric plasma chamber. A liner (not shown for simplicity) extends along the walls of the processing chamber 102. A movable wafer stage 104 configured to hold a wafer 106, e.g., a semiconductor wafer, is placed in the processing chamber 102. Wafer stage 104 includes an electrostatic chuck 108 and bottom electrode 110 embedded in the electrostatic chuck 108. In some embodiments, the wafer stage 104 include mechanisms to heat or cool the electrostatic chuck 108. For example, a backside cooling helium 112 is configured to cool the electrostatic chuck 108.

In some embodiments, wafer stage 104 acts as a moving cathode. In some embodiments, the electrostatic chuck 108 includes an aluminum base, or any other metal base. In some embodiments, the electrostatic chuck 108 includes a ceramic material on a surface 109 of the electrostatic chuck 108 that holds or interfaces with the wafer 106. A power supply 114 is connected to the bottom electrode 110. In some embodiments, the power supply 114 may be a radio frequency RF source power.

The wafer 106 may be a semiconductor wafer in any stage of a fabrication process to form semiconductor devices, e.g., integrated circuits or discrete devices, on a substrate of the wafer. In an embodiment, the wafer 106 comprises an ultra-low k dielectric layer and a metal layer over a semiconductor substrate. The wafer 106 can be a photomask, a semiconductor wafer, or other workpiece known to one of ordinary skill in the art of electronic device manufacturing. In at least some embodiments, the wafer 106 comprises any material to make any of integrated circuits, passive (e.g., capacitors, inductors) and active (e.g., transistors, photo detectors, lasers, diodes) microelectronic devices. The wafer 106 may include insulating (e.g., dielectric) materials that separate such active and passive microelectronic devices from a conducting layer or layers that are formed on top of them. In one embodiment, the wafer 106 is a semiconductor substrate that includes one or more dielectric layers, e.g., silicon dioxide, silicon nitride, sapphire, and other dielectric materials. In one embodiment, the wafer 106 is a wafer stack including one or more layers. The one or more layers of the wafer 106 can include conducting, semiconducting, insulating, or any combination of layers thereof.

The plasma system 100 also includes a plasma source 120. In some embodiments, the plasma source 120 includes a gas inlet 122 that inputs one or more process gases 124 into the plasma source 120. The one or more process gases 124 include a chemistry to modify or etch one or more surface layers of the wafer 106. The plasma source 120 includes a top electrode 126 that is coupled to a RF source power 128. In some embodiments, the plasma source 120 produces a plasma 130 from the one or more process gases 124 using a high frequency electric field. The plasma 130 includes plasma particles, such as ions, electrons, radicals, or any combination thereof. In some embodiments, the plasma source 120 may include a blocker plate (not shown) that reduces one or more of the ions, electrons, or radicals before the plasma 130 enters into the processing chamber 102. The RF power supply 114 is provided to the wafer stage 104 to energize or accelerate the plasma 130 to reach the wafer 106.

In some embodiments, the top electrode 126 is connected to a lower potential, e.g., ground potential. The plasma 130 may be generated and energized by the electrical field between the bottom electrode 110 and the top electrode 126.

In some embodiments, the processing chamber 102 includes outlet(s) 132 that is connected to a vacuum pump system (not shown for simplicity). The outlet 132 is configured to evacuate volatile products or other byproducts generated during the plasma etching process in the processing chamber 102.

In some embodiments, the plasma source 120 or some components of the plasma source 120, e.g., the top electrode 126, is coupled to one or more motors 140. The motors 140 drive the plasma source 120 or the top electrode 126 to move in one or more of a lateral direction, e.g., in the x-y plane, or a vertical direction, e.g., in the z-axis direction. For example, the motors 140 may drive the top electrode to tilt an acute angle with respect to the wafer 106 or the surface 109 of the electrostatic chuck 108. The motors 140 may include a liner motor and a lift motor.

In some embodiments, the wafer stage 104 or some components of the wafer stage 104, e.g., the electrostatic chuck 108, is coupled to one or more motors 142. The motors 142 drive the wafer stage 104 or the electrostatic chuck 108 to move in one or more of a lateral direction, e.g., in the x-y plane, or a vertical direction, e.g., in the z-axis direction. For example, the motors 142 may drive the electrostatic chuck 108 to tilt at an acute angle with respect to the plasma source 120, as will be discussed in detail with respect to FIG. 5. The motors 142 may include a liner motor and a lift motor.

The movement of the plasma source 120 (or components of the plasma source 120) or the wafer stage 104 (or components of the wafer stage 104) with respect to one another changes the direction, along which plasma particles of the plasma 130 hit the surface of the wafer 106 positioned on the wafer stage 104. The changes in the direction along which the plasma particles hit the surface of the wafer 106 will cause a metrology change on the features formed by the plasma etching, as will be further described herein.

In some embodiments, the plasma system 100 also includes a local adjustment blocker 144. The local adjustment blocker 144 can be removably positioned between the plasma source 120 and the wafer 106 positioned on the wafer stage 104. The local adjustment blocker 144 may be used to adjust the direction at which plasma particles of the plasma 130 hit a local region of the wafer 106, while blocking the plasma particles of the plasma 130 from hitting other regions of the wafer 106.

Figure 2:
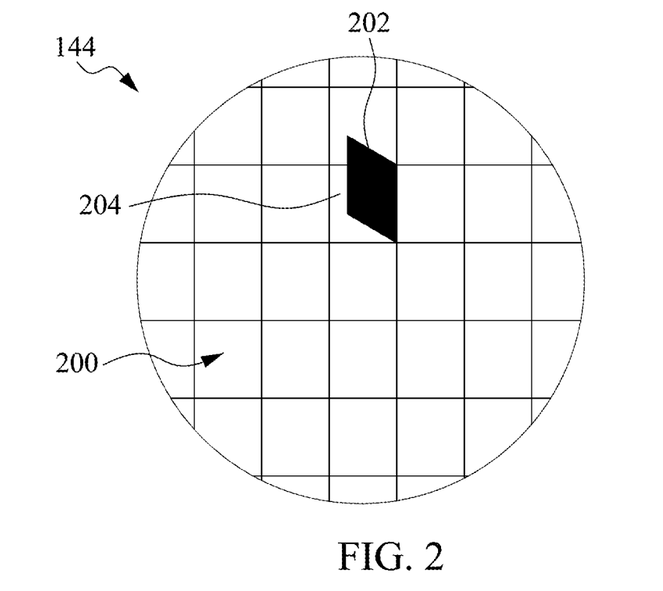
FIG. 2 is an example local adjustment blocker.

FIG. 2 shows an example embodiment of the local adjustment blocker 144. The local adjustment blocker 144 includes a plurality of division regions 200. In some embodiments, the size and shape of each division region 200 correspond to the size and shape of a feature on the wafer 106 that is formed or to be formed with the plasma etching. For example, the size and shape of the division regions 200 correspond to a die on the wafer 106.

In some embodiments, each division region 200 includes a foldable cover 202 and a through hole 204. When the foldable cover 202 is folded to cover the through hole 204, e.g., the foldable cover is folded to "close" position, the plasma particles of the plasma 130 are blocked by the division region 200. When the foldable cover 202 is folded to reveal the through hole 204, e.g., the foldable cover is folded to the "open" position, the through hole 204 is revealed to let plasma particles of the plasma 130 go through the through hole 204 and reach the corresponding region on the wafer 106.

A controller 150 is coupled to the one or more motors 140 and the one or more motors 142. The controller 150 functions to control the one or more motors 140 and/or the one or more motors 142 to drive the plasma source 120 (or a component of the plasma source 120) or the wafer stage 104 (or a component of the wafer stage 104), respectively, to move in one or more of a lateral direction or a vertical direction with respect to one another. In some embodiments, the one or more motors 140 and/or the one or more motors 142 may drive the plasma source 120 (or a component of the plasma source 120) or the wafer stage 104 (or a component of the wafer stage 104), respectively, to tilt an angle, e.g., an acute angle, with respect to one another, under the control of the controller 150.

In some embodiments, the controller 150 is communicatively or electronically coupled to a metrology unit 160. The metrology unit 160 functions to measure a metrology of a feature formed on the wafer 106. The metrology measurement results of the metrology unit 160 may be communicated to the controller 150. The controller 150 may control the one or more motors 140 and/or the one or more motors 142 based on the metrology measurement results provided by the metrology unit 160.

Figure 3:
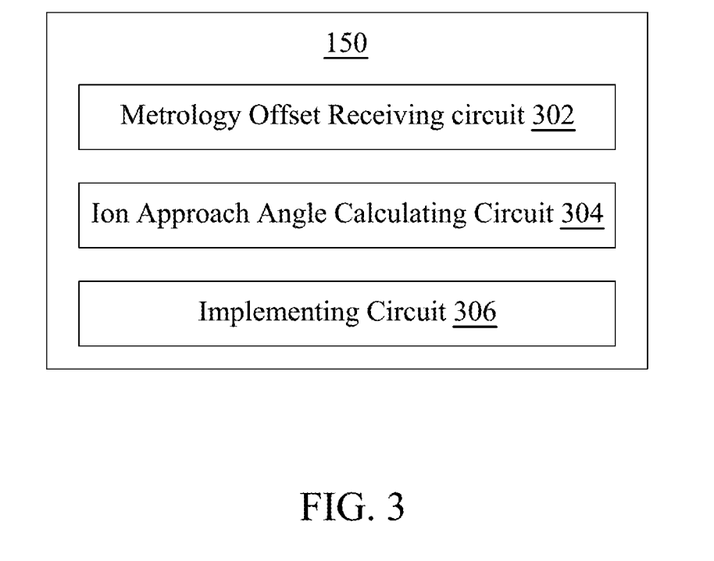
FIG. 3 is an example controller of the plasma etching system of FIG. 1.

FIG. 3 shows an example embodiment of the controller 150. As shown in FIG. 3, the controller 150 includes a metrology offset receiving circuit 302, an ion approach angle calculating circuit 304 and an implementing circuit 306. The metrology offset receiving circuit 302 is configured to receive, e.g., from the metrology unit 160, a metrology measurement result on a feature formed on a first wafer 106 on the wafer stage 104. The metrology measurement result may indicate that there is an offset between the actual position of the feature and the expected position of the feature on the first wafer 106. The ion approach angle calculating circuit 304 may calculate a change in an approach angle, along which the plasma particles of the plasma 130 hit the surface of the wafer 106 on the wafer stage 104. The ion approach angle may be varied based on the relative position between the plasma source 120 and the wafer stage 104. For example, the wafer stage 104 may be moved in the lateral x-y plane relative to the plasma source 120. The wafer stage 104 may be tilted at an angle with respect to the plasma source 120.

The implementing circuit 306 controls the one or more motors 140 and the one or more motors 142 to drive the plasma source 120 or the wafer stage 104, respectively, to achieve the relative position between the plasma source 120 and the wafer stage 104, and thus achieve the calculated ion approach angle along which plasma particles of the plasma 130 hit the wafer 106 positioned on the wafer stage 104.

Figure 4:
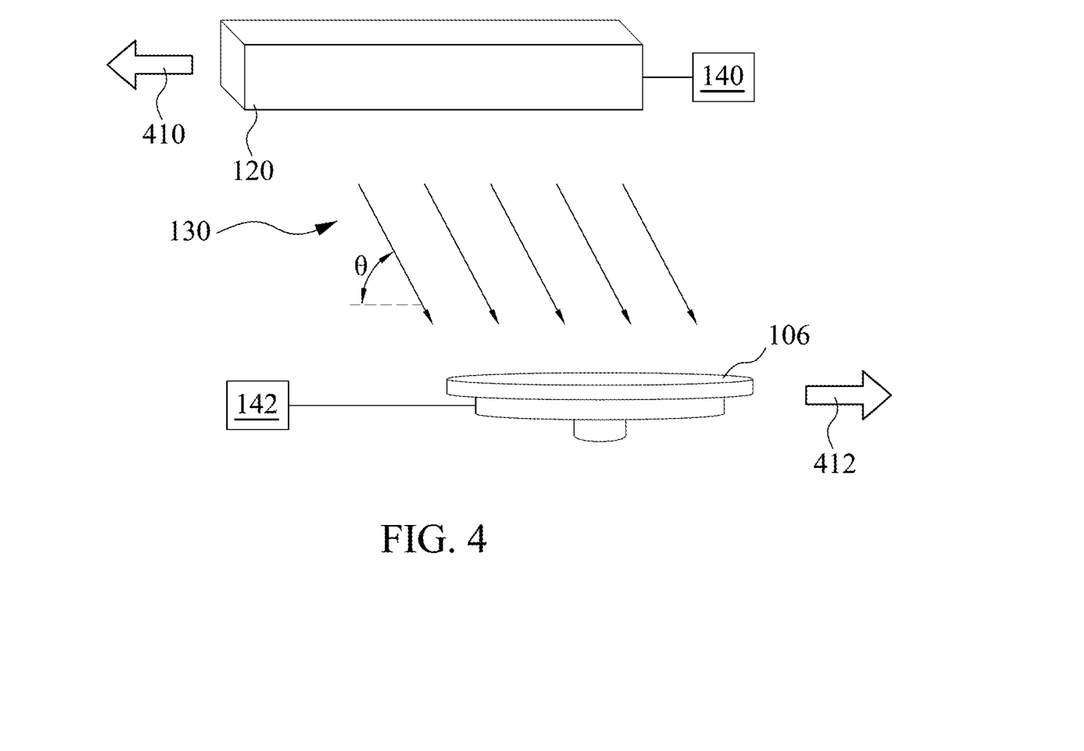
FIGS. 4-7 are example embodiments of setting ion approach angles in plasma etching.

FIG. 4 shows an example embodiment of varying the ion approach angle. As shown in FIG. 4, the motor 140 drives the plasma source 120 to move in a first lateral direction 410 and the motor 142 drives the wafer stage 104 to move in a second lateral direction 412 that is opposite to the first lateral direction 410. Due to the movements of the plasma source 120 and the wafer stage 104 in the lateral directions 410, 412, respectively, and the corresponding relative position between the plasma source 120 and the wafer stage 104, the direction of electrical field and the attraction force change accordingly. As such, the plasma particles in the plasma 130 are attracted to hit the surface 109 of the electrostatic chuck 108 of the wafer stage 104 or the surface of a wafer 106 (not shown) positioned on the surface 109 with an angle θ. The angle θ is calculated by the ion approach angle calculating circuit 304 based on the measurement metrology offset on a feature formed on the wafer 106, e.g., through a plasma etching procedure using the plasma 130.

Figure 5:
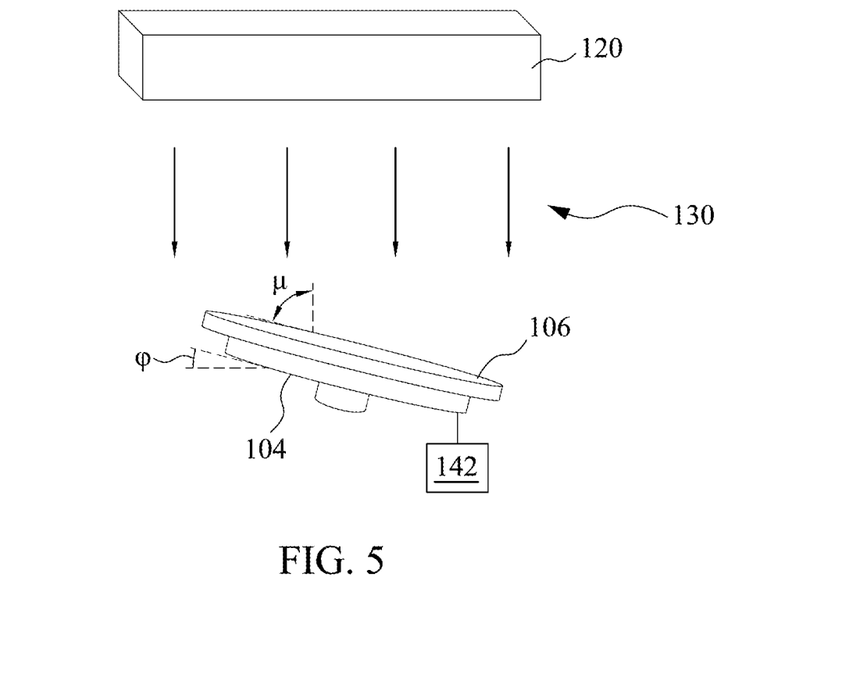

FIG. 5 shows an example embodiment of varying the ion approach angle. As shown in FIG. 5, the motor 142 drives the wafer stage 104 to tilt an acute angle Φ with respect to the plasma source 120. Due to the tile angle Φ, plasma particles in the plasma 130 hit the surface 109 of the electrostatic chuck 108 of the wafer stage 104 or the surface of a wafer 106 (not shown) positioned on the surface 109 with an angle μ. In some embodiments, Φ+μ=90 degrees. The angle Φ is calculated by the ion approach angle calculating circuit 304 based on the measurement metrology offset on a feature formed on the wafer 106, e.g., through a plasma etching procedure using the plasma 130.

Figure 6:
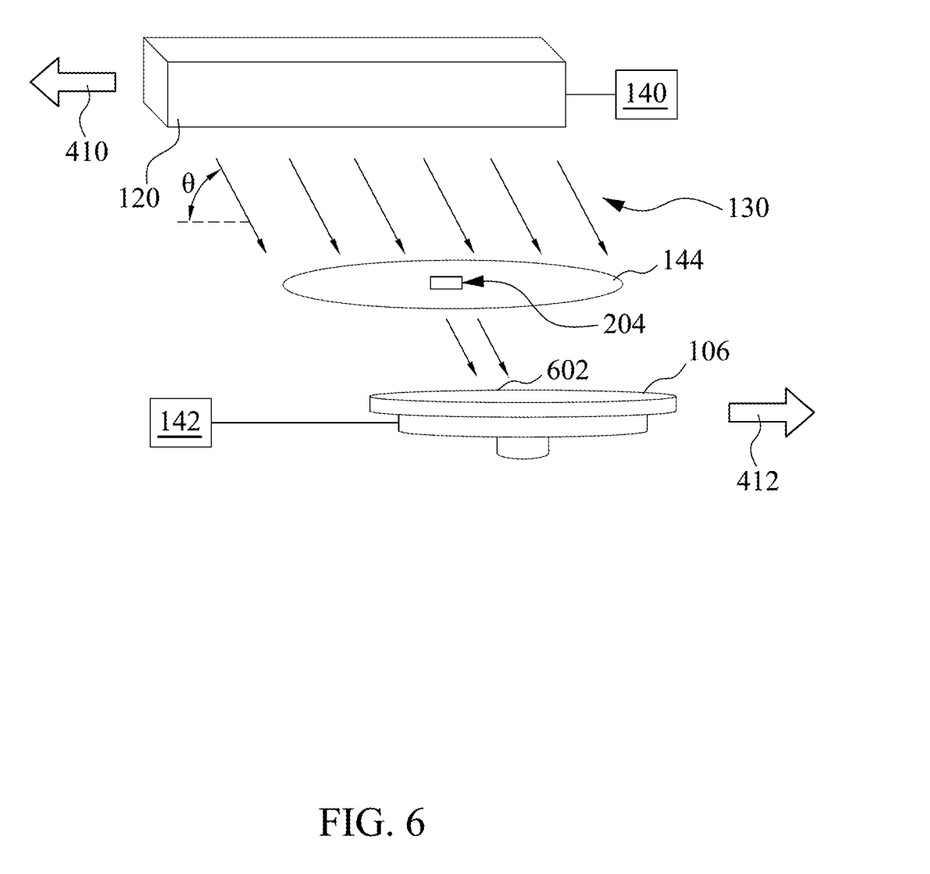

FIG. 6 shows an example embodiment of varying the ion approach angle for a local region 602 on the wafer 106. As shown in FIG. 6, the motor 140 drives the plasma source 120 to move in a first lateral direction 410 and the motor 142 drives the wafer stage 104 to move in a second lateral direction 412 that is opposite to the first lateral direction 410. Due to the movements of the plasma source 120 and the wafer stage 104 in the lateral directions 410, 412, respectively, and the corresponding relative position between the plasma source 120 and the wafer stage 104, plasma particles in the plasma 130 will hit the surface 109 of the electrostatic chuck 108 of the wafer stage 104 or the surface of a wafer 106 (not shown) positioned on the surface 109 with an angle θ. The local adjustment blocker 144 is positioned between the plasma source 120 and the wafer stage 104 along the path that plasma particles of the plasma 130 transit. One or more of the foldable covers 202 (not shown) are folded open so that the corresponding through holes 204 are revealed, which enables the plasma particles of the plasma to pass through and hit the corresponding local region 602 on the wafer 106 with the angle θ. The positioning of the local adjustment blocker 144 is controlled by the controller 150 to ensure the alignment between the through hole 204 and the corresponding local region 602 along the ion transit path so that plasma particles hits the local region 602 with the calculated approach angle θ.

Figure 7:
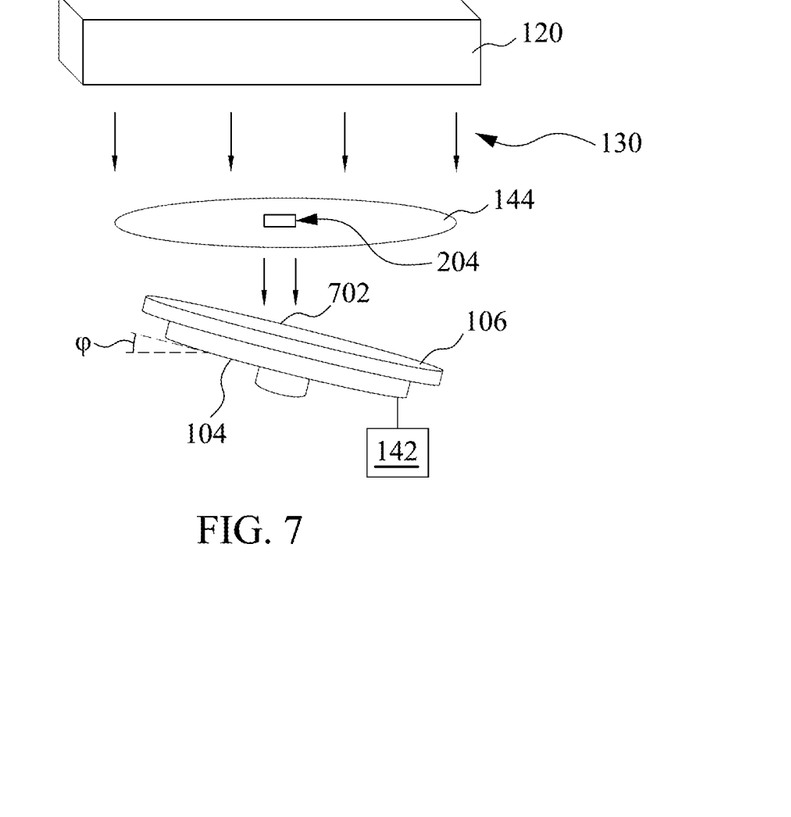

FIG. 7 shows an example embodiment of varying the ion approach angle for a local region 702 on the wafer 106. As shown in FIG. 7, the motor 142 drives the wafer stage 104 to tilt at an acute angle Φ with respect to the plasma source 120. Due to the tile angle Φ, plasma particles in the plasma 130 hit the surface 109 of the electrostatic chuck 108 of the wafer stage 104 or the surface of a wafer 106 (not shown) positioned on the surface 109 with an angle μ. In some embodiments, Φ+μ=90 degrees. The local adjustment blocker 144 is positioned between the plasma source 120 and the wafer stage 104 along the path that plasma particles of the plasma 130 transit. One or more of the foldable covers 202 (not shown) are folded open so that the corresponding through holes 204 are revealed, which enables the plasma particles of the plasma to pass through and hit the corresponding local region 702 on the wafer 106 with the angle μ. The positioning of the local adjustment blocker 144 is controlled by the controller 150 to ensure the alignment between the through holes 204 and the local regions 702 along the ion transit path so that plasma particles hit the local regions 702 with the calculated approach angle μ. The angle Φ is calculated by the ion approach angle calculating circuit 304 based on the measurement metrology offset on a feature formed on the wafer 106, e.g., through a plasma etching procedure using the plasma 130.

Figure 8:
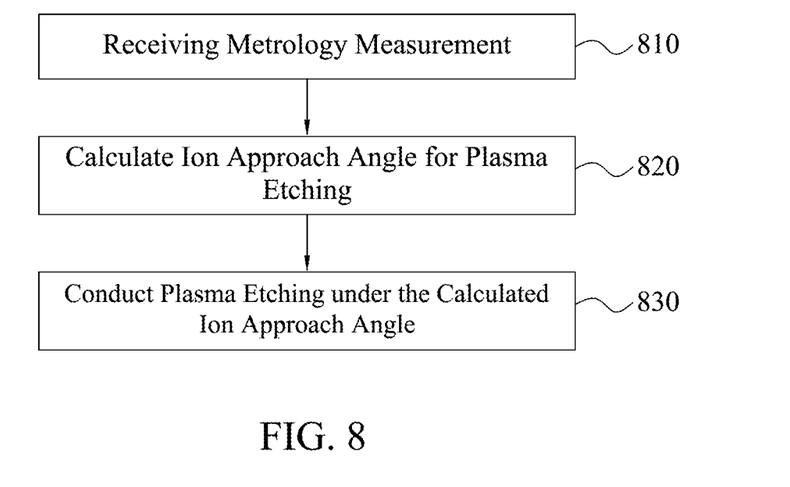
FIG. 8 is an example process of the example plasma system of FIG. 1.
Figure 9A:
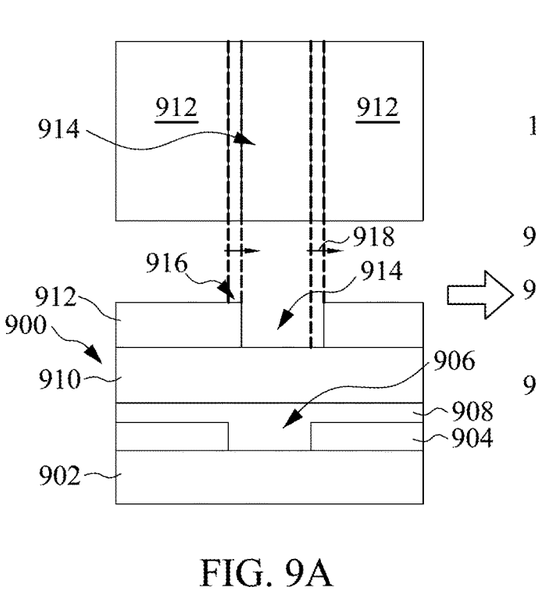
FIGS. 9A-9C show operations of the example plasma system of FIG. 1 on an example wafer.
Figure 9B:
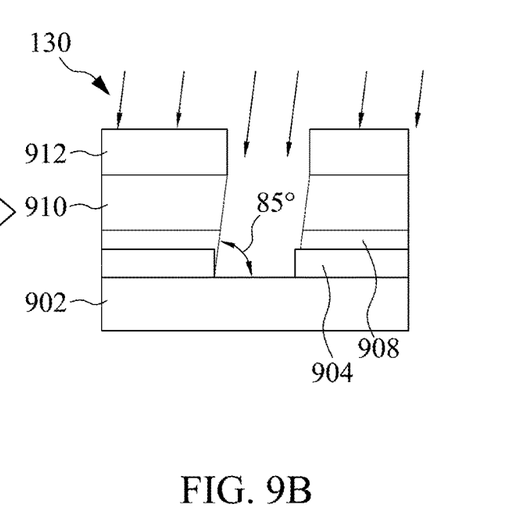
Figure 9C:
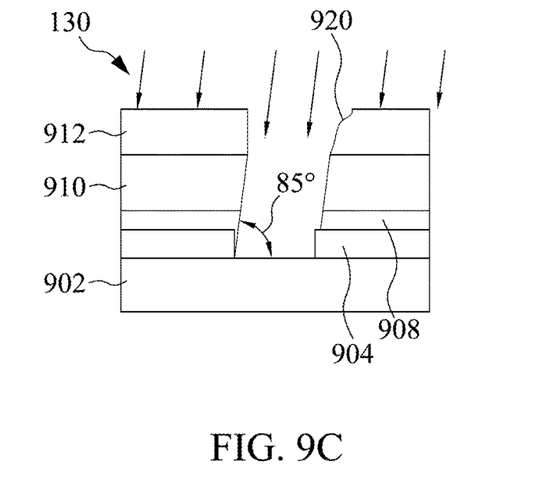

FIG. 8 is a flow diagram of an example process 800 of the plasma system 100. FIGS. 9A-9C show operations of the process 800 on an example wafer 900. Referring to FIG. 8 and FIG. 9A, in example operation 810, the metrology offset receiving circuit 302 receives a metrology measurement on a feature formed on the wafer 900. FIG. 9A shows that the wafer 900 includes a substrate 902 and a patterned first hard mask layer 904 over the substrate 902. The first hard mask layer 904 includes an opening 906. A second hard mask layer 908 is on the first hard mask layer 904 and fills the opening 906. The first hard mask layer 904 and the second hard mask layer 908 may be metal oxide materials, e.g., $Al_2O_3$, $Ta_2O_5$, metal nitride materials like TiN or TaN, or silicon-containing hard mask materials like SiN, SiON, or other suitable hard mask materials such as TEOS (Tetraethyl Orthosilicate), and may be formed through Atomic layer deposition, focused ion beam, chemical vapor deposition, spin-on processes or other suitable deposition approaches. A barrier layer 910, e.g., an Ir (iridium) based barrier layer, is on the second hard mask layer 908. Other materials for the barrier layer 910 may include cobalt, ruthenium, tantalum, tantalum nitride, indium oxide, tungsten nitride, and titanium nitride or other suitable materials for barrier layers. A photoresist layer 912 is on the barrier layer 910. The photoresist layer 912 includes an opening 914 formed, e.g., by exposure and development. The opening 914 on the photoresist layer 912 is supposed to overlap and be in vertical alignment with the opening 906 on the first hard mask layer 904.

The metrology measurement results indicate that there is a lateral offset 916 between the expected position of the opening 914 and the actually formed position of the opening 914. The actually formed opening 914 drifts in the direction 918 from the expected position of the opening 914 and thus is misaligned with the opening 906. If the same plasma etching is further conducted through the misaligned opening 914, the opening 906 on the first hard mask layer 904 may not be fully exposed, and the features to be formed on the substrate 902 through the opening 906 of the first hard mask layer 904 may also include metrology offset because the opening 906 is not fully exposed.

In example operation 820, the ion approach angle calculating circuit 304 calculates an ion approach angle based on the metrology measurement results. The calculated ion approach angle defines a direction at which the plasma particles of plasma 130 hit the surface of the wafer 106 so as to compensate for the offset in the metrology of a feature. Specifically, for the illustrative example of FIG. 9A, the offset 916 on the opening 914 reflects a shift between the opening 914 on the photoresist layer and the opening 906 on the first hard mask layer 904. The calculated ion approach angle will compensate for this shift between the opening 914 and the opening 906. As illustratively shown in FIG. 9B, the ion approach angle calculating circuit 304 calculates that if the plasma particles of the plasma 130 hits the barrier layer 910 and the second hard mask layer 908 with an angle of about 85 degrees to about 89 degrees, and in some embodiments about 87.7 degrees, through the opening 914 on the photoresist layer 912, the second hard mask layer 908 in the opening 906 will be completely accessed and removed and the opening 906 will be exposed following the plasma etching with the ion approach angle of 85 degrees. In some embodiments, the ion approach angle is calculated based on the size of the offset and the distance between the opening 914 and the opening 906. For example, in a case that the offset 916 is A, and a vertical distance between bottom surface of photoresist layer 912 and a top surface of substrate 902 is B, the ion approach angle may be calculated as arctan (B/A).

In example operation 830, the implementing circuit 306 controls the movement of one or more of the plasma source 120 or the wafer stage 104 to effectuate the ion approach angle of 85 degrees as calculated in the operation 820. The movements of the plasma source 120 or the wafer stage 104 may be one or more of the embodiments shown in FIGS. 4-7 or other movements. The plasma etching is then conducted with the updated ion approach angles to pattern the barrier layer 910 and the second hard mask layer 908 so as to expose the opening 906 on the first hard mask layer 904. As shown in FIG. 9C, because of the ion approach angle of about 85 degrees, a corner 920 of the photoresist layer 912 besides the opening 914 is etched out to become a slope. The sloped corner 920 facilitates the removal of the barrier layer 910 and the second hard mask layer 908 in the angled path of the plasma 130. It should be appreciated that the layers shown between the photoresist layer 912 and the first hard mask layer 904 are all for illustration and description purposes. There may be more layers or less layers between the photoresist layer 912 and the first hard mask layer 904 (e.g., as a target of the etching), which are all within the scope of the disclosure. Further, in some scenarios, the photoresist layer 912 may be formed directly on the substrate 902 for etching a feature on the substrate 902, and the techniques described herein may be used to compensate for the misalignment of the patterned photoresist layer 912 with respect to the to-be-etched feature on the substrate 902.

FIGS. 10A-10D show an example wafer 1000 under operations of the process 800. The example wafer 1000 includes a prelayer 1010, a hard mask layer 1020, a barrier layer 1030 and a patterned photoresist layer 1040. The prelayer 1010 includes a feature structure 1012. The prelayer 1010 may be any layer in a front-end-of-line process or a back-end-of-line process. For example, the prelayer 1010 is a metallization layer of copper and the feature structure 1012 is a copper wiring structure to be formed by patterning the metallization layer mask 1010 through etching. The hard mask layer 1020 may be a metal oxide, a metal nitride, a silicon-containing hard mark layer or other suitable materials for hard mask. The barrier layer 1030 may be iridium, cobalt, ruthenium, tantalum, tantalum nitride, indium oxide, tungsten nitride, and titanium nitride or other suitable materials for barrier layers. The patterned photoresist layer 1040 is configured to prevent the feature structure 1012 from being exposed through the plasma etching procedure to pattern the barrier layer 1030 and the hard mask layer 1020.

Figure 10A:
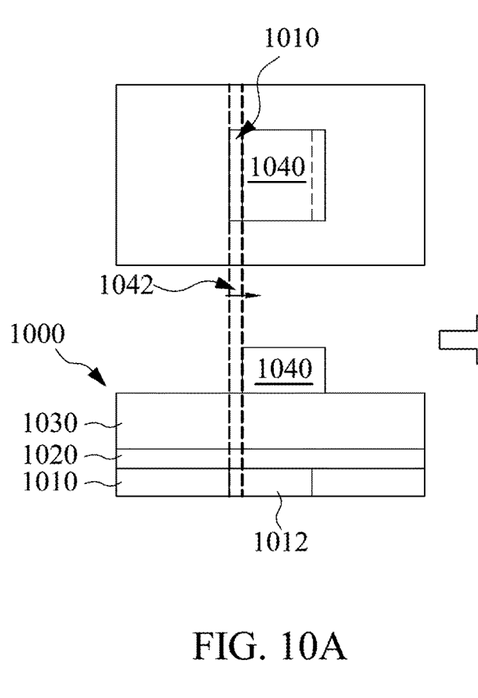
FIGS. 10A-10D show operations of the example plasma system of FIG. 1 on an example wafer.

As shown in FIG. 10A, there is an offset error 1042 on the metrology of the patterned photoresist layer 1040. Resultantly, the patterned photoresist layer 1040 misaligns with the feature structure 1012 on the prelayer 1010. As an illustrative example, the offset error is measured as 30 about angstrom (Å). The distance between the photoresist layer 1040 and the feature structure 1012, e.g., 700 Å, is the overall thickness of the barrier layer 1030, e.g., 450 Å, and the hard mask layer 1020, e.g., 250 Å.

Figure 10B:
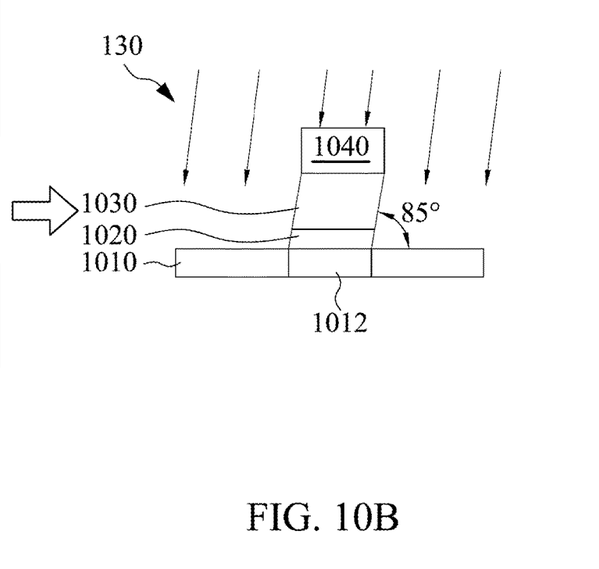

As shown in FIG. 10B, an ion approach angle is calculated. For example, the ion approach angle is calculated for the distance between the photoresist layer 1040 and the feature structure 1012 and the offset. For example, in a case that the offset 1042 is C, and a vertical distance between bottom surface of photoresist layer 1040 and a top surface of prelayer 1010 is D, the ion approach angle may be calculated as arctan (D/C). In this illustrative example, the calculated ion approach angle is about 87.7 degrees.

Figure 10C:
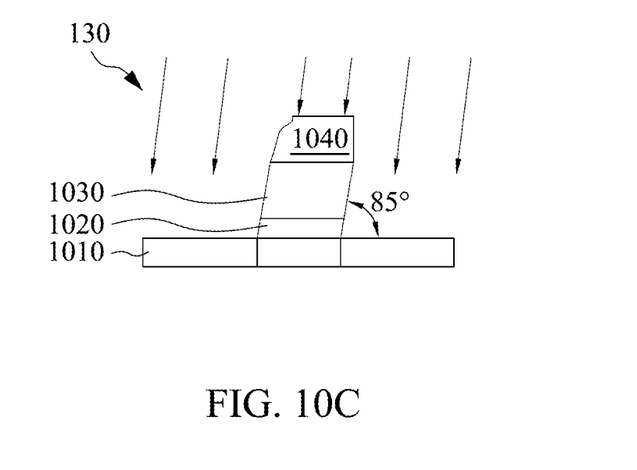

As shown in FIG. 10C, the relative position between the plasma source 120 and the wafer stage 104 are set based on the calculated ion approach angel. The plasma etching is then conducted to pattern the barrier layer 1030 and the hard mask layer 1020. As shown in FIG. 10C, with the calculated ion approach angle, the patterned photoresist layer 1040 is able to block the plasma particles of the plasma 130 from reaching the feature structure 1012 on the prelayer 1010. In some embodiments, a corner portion 1044 of the patterned photoresist layer 1040 may be etched out, which facilitates the removal of the barrier layer 1030 and the hard mask layer 1020 in the path that plasma particles of the plasma 130 travel.

Figure 10D:
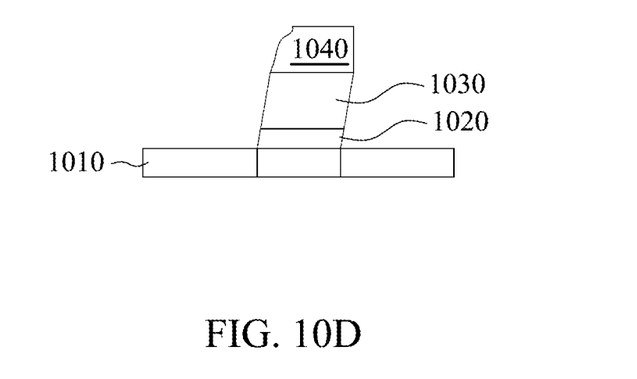

FIG. 10D shows that after the plasma etching with the calculated ion approach angle of 87.7 degrees, the shifted photoresist layer 1040 effectively prevents the feature structure 1012 from being exposed.

FIGS. 9A-9C and 10A-10D show examples that misalignment between layers on a same wafer 106 are compensated for using the updated ion approach angles of the plasma etching. Those examples do not limit the scope of the disclosure. The techniques may also be used in other application scenarios. For example, metrology errors on a first wafer may be analyzed and adjustment of ion approach angle of the plasma etching may be implemented on a second wafer to correct the errors that occur on the first wafer.

The disclosure can be further understood with the following embodiments:

In a first embodiment, a system includes: a plasma processing chamber; a wafer stage, structured to be positioned in the plasma processing chamber and to hold a wafer; a plasma source, structured to be positioned in the plasma processing chamber and to emit plasma of ions into the plasma processing chamber and toward the wafer stage; a metrology unit configured to determine a metrology measurement of a feature on the wafer; and a control mechanism, configured to vary a first angle between a transit path of the ions of the plasma of ions and a surface of the wafer held on the wafer stage based on the metrology measurement of the feature.

In a second embodiment, a method includes: receiving a metrology measurement information of a first feature on a first layer of a wafer; determining an alignment state between the first feature and a second feature on a second layer of the wafer; determining an ion approach angle of a plasma etching based on the alignment state; and conducting the plasma etching on the wafer along the ion approach angle using a plasma system.

In a third embodiment, a method includes: receiving a wafer having a second layer over a substrate and a first layer over the second layer on a first surface of the wafer, the first layer including a patterned first feature; determining that the patterned first feature includes a metrology error; and forming a second feature on the second layer through plasma etching using the patterned first feature as a mask. The forming the second feature includes determining a direction along which ions of the plasma etching hit the first surface of the wafer based on the metrology error; and conducting the plasma etching according to the direction along which the ions of the plasma etching hit the first surface of the wafer.

The various embodiments described above can be combined to provide further embodiments.

These and other changes can be made to the embodiments in light of the above detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
   a plasma processing chamber;
   a wafer stage, structured to be positioned in the plasma processing chamber and to hold a wafer;
   a plasma source, structured to be positioned in the plasma processing chamber and to emit plasma of ions into the plasma processing chamber and toward the wafer stage;
   a metrology unit configured to determine a metrology measurement of a feature on a first wafer held on the wafer stage; and
   a control mechanism, configured to vary a first angle between a transit path of the ions of the plasma of ions and a surface of a second wafer held on the wafer stage based on the metrology measurement of the feature on the first wafer, the second wafer subsequent to the first wafer.

2. The system of claim 1, wherein the feature is a patterned feature in a photoresist layer on the first wafer.

3. The system of claim 2, wherein the first angle is varied based on a misalignment between the photoresist layer and to-be-formed target feature under the photoresist layer obtained through the metrology measurement.

4. The system of claim 1, wherein the control mechanism includes a first motor that drives the wafer stage to move in a lateral direction with respect to the plasma source.

5. The system of claim 1, wherein the control mechanism includes a second motor that drives the wafer stage to tilt a second angle with respect to the plasma source.

6. The system of claim 1, wherein the control mechanism includes a third motor that drives the plasma source to move in a lateral direction with respect to the wafer stage.

7. The system of claim 1, wherein the control mechanism includes a fourth motor that drives the plasma source to tilt a third angle with respect to the wafer stage.

8. The system of claim 4, wherein the first motor is a linear motor.

9. The system of claim 5, wherein the second motor is a lift motor.

10. The system of claim 1, further comprising a blocker configured to be removably positioned between the plasma source and the wafer stage, the blocker including a plurality of through holes and a plurality of foldable covers, each foldable cover corresponding to a respective through hole and configured to cover or reveal the respective through hole.

11. The system of claim 10, wherein each through hole of the plurality of through holes corresponds to a surface region of the wafer.

12. The system of claim 10, wherein a shape and a dimension of each through hole corresponds a die on the wafer.

13. A method, comprising:
    forming a first feature on a first layer of a wafer;
    receiving a metrology measurement information of the first feature formed on the first layer of the wafer;
    determining an alignment state between the first feature and a second feature on a second layer of the wafer;
    adjusting an ion approach angle of a plasma etching for a third feature to be formed on the wafer based on the alignment state between the first feature and the second feature; and
    conducting the plasma etching on the wafer along the adjusted ion approach angle using a plasma system to form the third feature.

14. The method of claim 13, wherein the second layer is lower than the first layer with respect to a substrate of the wafer.

15. The method of claim 13, wherein the adjusting the ion approach angle of the plasma etching includes moving at least one of a wafer stage or a plasma source of the plasma system with respect to one another.

16. The method of claim 15, wherein the moving includes one or more of moving in a lateral direction or tilting.

17. The method of claim 13, wherein the adjusting the ion approach angle includes calculating the ion approach angle based on an offset between the first feature and the second feature and a vertical distance between the first feature and the second feature.

18. The method of claim 13, wherein the conducting the plasma etching on the wafer includes positioning a blocker element between a wafer stage and a plasma source of the plasma system, the blocker element including a through hole allowing ions to pass through along the ion approach angle.

19. A method, comprising:
forming a patterned first feature on a first layer of a wafer, the wafer having a second layer over a substrate and the first layer over the second layer on a first surface of the wafer;
determining that the patterned first feature includes a metrology error; and
forming a second feature on the second layer through plasma etching using the patterned first feature as a mask, the forming the second feature including:
adjusting a direction along which ions of the plasma etching hit the first surface of the wafer based on the metrology error; and
conducting the plasma etching according to the adjusted direction along which the ions of the plasma etching hit the first surface of the wafer.

20. The method of claim 19, wherein the plasma etching is conducted in a device including:
a plasma chamber;
a wafer stage in the plasma chamber and configured to hold a wafer; and
a plasma source coupled to the plasma chamber and configured to emit plasma of ions into the plasma chamber; and
wherein the adjusting the direction along which ions of the plasma etching hit the first surface of the wafer includes varying a relative position between the wafer stage and the plasma source to change the direction along which the ions of the plasma hit the first surface of the wafer.

* * * * *